US006946869B2

United States Patent
Jacobson et al.

(10) Patent No.: US 6,946,869 B2
(45) Date of Patent: Sep. 20, 2005

(54) METHOD AND STRUCTURE FOR SHORT RANGE LEAKAGE CONTROL IN PIPELINED CIRCUITS

(75) Inventors: Hans M. Jacobson, White Plains, NY (US); Pradip Bose, Yorktown Heights, NY (US); Alper Buyuktosunoglu, Putnam Valley, NY (US); Peter William Cook, Mount Kisco, NY (US); Philip George Emma, Danbury, CT (US); Prabhakar N. Kudva, New York, NY (US); Stanley Everett Schuster, Granite Springs, NY (US)

(73) Assignee: International Business Machines Corporation, Armonk, NY (US)

( * ) Notice: Subject to any disclaimer, the term of this patent is extended or adjusted under 35 U.S.C. 154(b) by 49 days.

(21) Appl. No.: 10/685,863

(22) Filed: Oct. 15, 2003

(65) Prior Publication Data
US 2005/0083081 A1 Apr. 21, 2005

(51) Int. Cl.[7] ............................................. H03K 17/16
(52) U.S. Cl. ........................... 326/33; 326/93; 327/544
(58) Field of Search .............................. 326/33, 34, 82, 326/83, 93; 327/544

(56) References Cited

U.S. PATENT DOCUMENTS 6,169,419 B1 * 1/2001 De et al. ...................... 326/58
6,208,171 B1 * 3/2001 Kumagai et al. ........... 326/121

* cited by examiner

Primary Examiner—Daniel Chang
(74) Attorney, Agent, or Firm—Keusey, Tutunjian & Bitetto, P.C.; Satheesh K. Karra, Esq.

(57) ABSTRACT

Leakage current control devices include a circuit having one or more functions in a data path where the functions are executed in a sequence. Each of the functions has power reduction logic to energize each respective function. A leakage control circuit interacts with the power reduction logic, so that the functions are energized or deenergized in a control sequence such that the functions where the data is resident are energized and at least one of the other functions is not energized.

50 Claims, 9 Drawing Sheets

Pipeline structure

Implementation of CTL

Timing waveforms

METHOD AND STRUCTURE FOR SHORT RANGE LEAKAGE CONTROL IN PIPELINED CIRCUITS

BACKGROUND OF THE INVENTION

1. Field of the Invention

The present invention relates to microelectronic circuits, and more particularly to a structure and method to control leakage current in subunit microelectronic circuits.

2. Description of the Related Art

Power consumption due to leakage current is increasing rapidly in modern very large scale integration (VLSI) design and is becoming a significant problem in not only meeting the thermal envelope in high performance designs, but also meeting power dissipation constraints in low-power portable devices.

Conventional designs require a control signal that activates or deactivates leakage reduction logic. This is typically performed at chip level; for example, a processor goes into sleep mode. One long-standing problem includes leakage at the subunit level, which is typically not controlled (in both hardware and for predictive method techniques), for example, in microprocessors and memories, such as at pipeline stages, or portions of pipeline stages.

Therefore, a need exists for a system and method for controlling leakage at the subunit level in electronic circuits.

SUMMARY OF THE INVENTION

Leakage current control devices in a circuit include one or more functions in a data path where the functions are executed in a sequence. Each of the functions has power control to energize each respective function. A leakage control circuit interacts with the power controls, so that the functions are energized or deenergized in a control sequence such that the functions where the data is resident are energized and at least one of the other functions is not energized.

A system for controlling power consumption includes a unit level device including one or more subunits, a power control mechanism for selectively shutting down a portion of the unit level device and at least one subunit device including a leakage current control device. The leakage control device includes a circuit having one or more functions in a data path where the functions are executed in a sequence. Each of the functions has power reduction logic to selectively energize each respective function. A leakage control circuit interacts with the power reduction logic, so that the functions are energized or deenergized in a control sequence such the functions where the data is resident are energized and at least one of the other functions, is not energized.

The devices and features set forth herein may be combined in full or in part at different levels of a circuit design to provide a more complete and/or efficient power reduction scheme in accordance with the invention.

These and other objects, features and advantages of the present invention will become apparent from the following detailed description of illustrative embodiments thereof, which is to be read in connection with the accompanying drawings.

BRIEF DESCRIPTION OF DRAWINGS

The invention will be described in detail in the following description of preferred embodiments with reference to the following figures wherein.

DETAILED DESCRIPTION OF PREFERRED EMBODIMENTS

Aspects of the present disclosure provide an improved system and method to control leakage current in microelectronic circuits. The improved systems and methods are particularly useful for controlling leakage current in subunit parts of microelectronic circuits, e.g., pipeline stages or parts of pipeline stages. By controlling leakage currents at the subunit level, energy is conserved and power consumption is reduced, making these systems more attractive for portable device applications. The present disclosure addresses systems and methods to reduce such leakage currents and demonstrates these illustratively in terms of pipelined VLSI circuits. The present disclosure provides techniques to dynamically control leakage at the fine-grained pipeline stage level. Previous methods address leakage at the higher chip or unit levels and are used only in a sleep-mode context. As leakage continues to increase with the scaling of CMOS technology, it is becoming important to address leakage at finer levels of granularity, such as the pipeline stage level, and during active computation (not just sleep mode).

This disclosure introduces cost-effective techniques to make use of supply voltage (Vdd) and ground (Gnd) gating as well as transistor body biasing, high Vt and thick oxide to reduce leakage power at the pipeline stage level. Dynamic control of leakage reduction techniques will be addressed herein to enable leakage power savings not only in sleep mode, but also during active computation. The present disclosure further provides a comprehensive set of techniques and conditions under which leakage reduction techniques can be applied to data paths and registers.

Methods for reducing leakage in accordance with the present disclosure may include activation and deactivation conditions for leakage reduction circuitry in synchronous and asynchronous pipelines based on data valid and data hold conditions, multi-stage look-ahead extensions for improving deactivation decisions to further reduce power, and provide early activation for reduced di/dt effects, and pulse-wave controlled activation/deactivation that maximizes the time spent in reduced leakage mode. Used with forward body biasing/reverse body biasing (FBB/RBB) threshold voltage (Vt) biasing this technique can improve critical path delay as well as reduce leakage power. In addition, combined operation of unit level and stage level leakage control may also be employed for improved decision making through unit level look-ahead, and reduced stage level control complexity and wait states through cycle bounded maximum leakage control support at the unit level.

It should be understood that the elements shown in the FIGS. may be implemented in various forms of hardware, software or combinations thereof. Preferably, these elements are implemented in hardware on one or more appropriately programmed general-purpose digital computers having a processor and memory and input/output interfaces.

Figure 1:
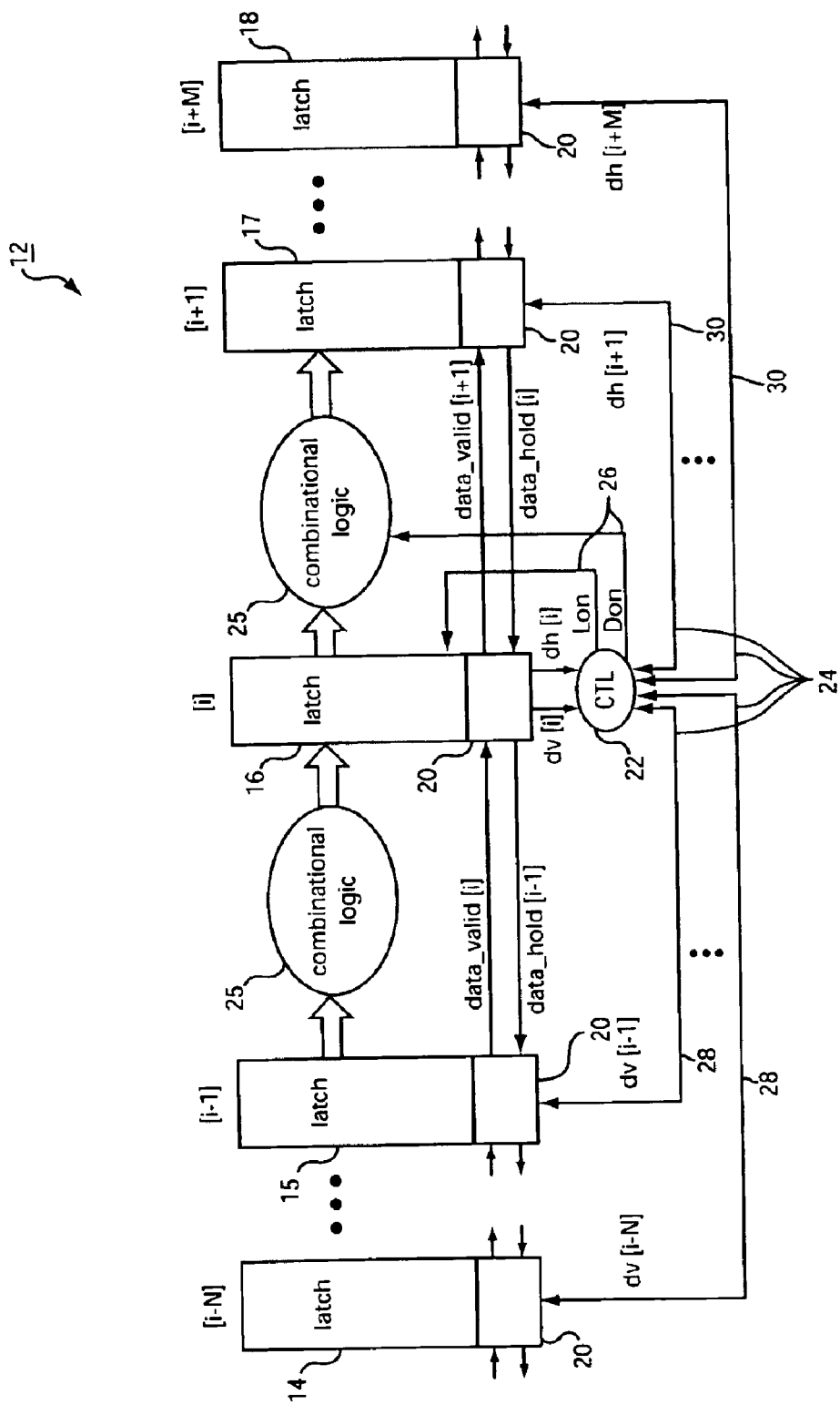
FIG. 1 is a block diagram showing an embodiment of the present leakage control device used at a sub unit level of a microelectronic circuit.
Figure 2:
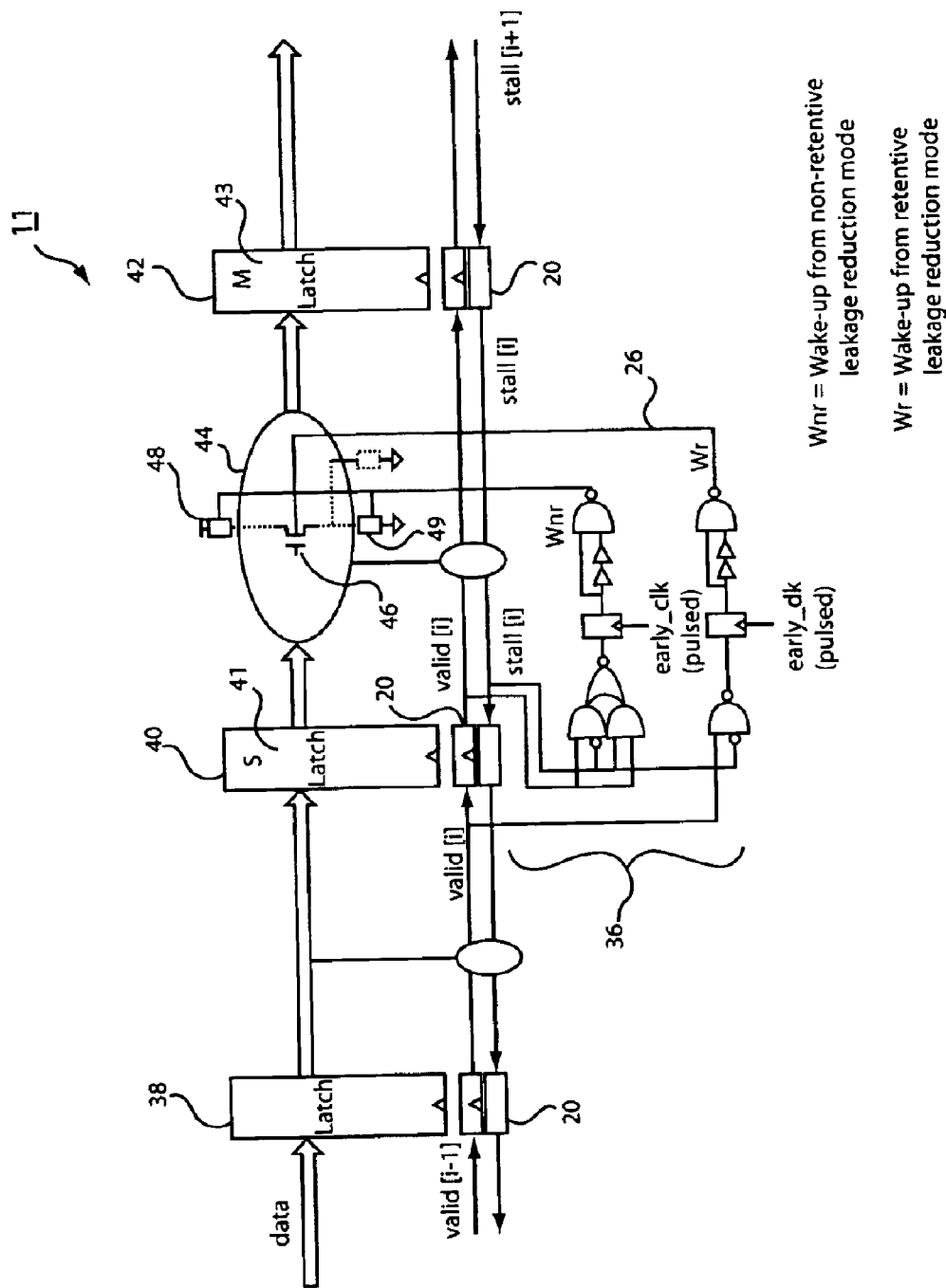
FIG. 2 is a block diagram showing a circuit with control logic for selectively energizing or deenergizing portions of the circuit in accordance with aspects of the present invention.

Referring now to the drawings in which like numerals represent the same or similar elements and initially to FIGS. 1 and 2, leakage current controlled devices are shown for reducing current leakage within circuits 12 and 11, respectively. Each circuit 11 and 12 includes a plurality of stages, functions or latches in a pipeline for performing one or more functions in a data path. Stages are labeled [i−N] to [i+M] in FIG. 1. Stages may include data latches 14, 15, 16, 17 and 18 as well as combination logic 25 functions. Functions [i−N], [i−1], [i], [i+1] and [i+M] are preferably executed in a sequence. Each of the functions includes a control circuit 20 that tracks the data valid and data hold conditions of the respective functions.

A leakage control circuit 22 includes one or more inputs 24 and one or more outputs 26. The inputs 22 each connect to one of the control circuits 20, so that upon activating the control circuits 20 in a control sequence the leakage control circuit 22 asserts its output signals 26 such that functions 14–18, 25 are selectively energized so that data progresses along the data path to be resident at each function in the sequence. In this way, the function where the data is resident is energized and at least one of the other functions is not energized to conserve power. Throughout this disclosure, a plurality of methods and systems will be described which reduce current leakage.

Circuit 12 may include combinational logic 25. Logic 25 may include one or more devices, which selectively activate or deactivate portions of circuit 12 to reduce current leakage and to conserve power. If circuit 12 includes a pipeline, the logic 25 may include, for example, combinational logic in a pipeline stage, sequential logic in a pipeline stage, tile functions in one or more pipeline stages.

In other embodiments, device 10 may include one or more look ahead inputs 28 (e.g., data_valid lines) to the leakage control circuit 22. Each of the look ahead inputs 28 monitors whether there is valid data held in a prior stage or function (14–18) of the pipeline.

Leakage control circuit 22 de-energizes one or more current stages if: a. there is no data in the current stage and b. each of the look behind inputs indicates there is no data in one or more of the prior stages. A current stage ([i] in this example) is de-energized if the look behind input 28 indicates there is no valid data in one or more of the prior stages.

Device 10 may include one or more look behind inputs 30 (e.g., data_hold lines) to the leakage control circuit 22. Each of the look behind inputs 30 monitors whether there is a data hold condition in a subsequent stage of the pipeline. The leakage control circuit 22 may de-energize or partially de-energize one or more current stages if: a. there is valid data in the current stage, b. the current stage is in a data hold condition, and c. all of the look behind inputs indicate there is a data hold condition. A stage may be partially de-energized if the stage includes valid data and is in a data hold condition.

Referring to FIG. 2, another device 11 having a circuit 13 is illustratively shown which includes a synchronous pipeline having a leakage control circuit 36. A plurality of stages 38, 40 and 42 each includes a control circuit 20, which enables the leakage control circuit 36 in accordance with states of the stages. Each stage includes a master M and a slave S function. In a synchronous pipeline, valid and stall information conditions are feed back to control circuit 36 to permit selective activation/deactivation of logic 44. In this case logic 44 includes one or more devices 46, 48 and 49 to dynamically control the leakage through power/ground gating, Vt biasing, etc. Each latch (38–42) may include one or more master and slave components, which may be individually controlled. In one case, output 26 of leakage control circuit 36 can also be used to reduce leakage in, say a slave function 41 and a master function 43.

Leakage Control in Pipelines

There are two main approaches to reduce the leakage of a circuit, retentive and non-retentive. Retentive techniques keep the values of internal nodes in the logic (say logic 44) network intact by, e.g., applying partial Vdd/Gnd gating (through gates 48 and 49, respectively) or increasing the threshold voltage (Vt) of the individual transistors (say, transistor 46). Non-retentive techniques do not keep the values on internal nodes in the logic network. Non-retentive techniques may therefore provide a higher degree of leakage reduction, but may have a high overhead in the logic necessary to implement the techniques. The present invention provides control techniques for application of both retentive and non-retentive leakage reduction techniques.

When retentive techniques are used, the state of the circuit is kept intact even while the leakage reducing logic is active. However, while active such techniques may slow down the data/control-path logic to a degree where cycle time may not be met. Retentive techniques should therefore be applied when either: I) there is no computation to perform, or II) when the current value is held. Retentive techniques can be applied during a hold condition since there is no active computation performed while the data is held constant.

In a synchronous pipeline these conditions can be expressed by the use of data valid and data hold (stall) conditions. Given a valid and stall signal the conditions for when the data/control-path is required to be active is given by the following expression:

$$\text{active\_retentive}_i = \text{valid}_i \char`^ \neg \text{stall}_i$$

When active is true, that is, when there is new valid data arriving and there is no stall (hold) condition, the data/control-path logic of the stage is active (e.g., the leakage reduction logic is turned off). Whenever active is false, the stage can be deactivated (the leakage reduction logic can be turned on). FIGS. 1 and 2 illustrate embodiments of activation logic 25 and 44 (or power reduction logic).

In an asynchronous pipeline, the given conditions can be expressed by the use of request and acknowledge signals (instead of valid and hold as indicated in FIG. 1). The data/control-path logic is activated when a request arrives and deactivated when an acknowledge is received. As there is no indication of values being held available in asynchronous pipelines, the leakage reduction logic cannot be activated during hold (stall) conditions. The asynchronous nature of the request signals allows more flexibility in making the signals available early for activation of the data/control-path logic. Since the arrivals of request and acknowledge signals are asynchronous with respect to each other, there may be a chance the acknowledge will arrive slightly before the next request. In evenly balanced pipelines such situations can be reduced by taking the request used in the leakage decision logic a bit earlier from the completion detection logic (e.g., matching delay). The request used in the clock logic is preferably not taken early.

When non-retentive techniques are used, the state of the circuit is not kept intact while the leakage reducing logic is active. Such techniques can be applied when there is no need to hold the state of the data/control-path logic. Non-retentive techniques can therefore be applied whenever there is no computation to perform, and preferably not when there is a hold condition. In a synchronous pipeline this condition can be expressed by the use of data valid and data hold conditions. Given a valid and hold signal retentive leakage reduction logic of the data/control-path of a pipeline stage can therefore be activated when the following expression is true- $$\text{active\_nonretentive}_i = (\text{valid}_i \,\hat{}\, \neg \text{stall}_i) \,\, (\text{valid}_{i+1} \,\hat{}\, \neg \text{stall}_i).$$

Since retentive techniques do not completely cut off power and ground, the internal nodes of the data/control-path logic will not float up to full Vdd (or down to full Gnd) (see e.g., FIG. 2). It may therefore be possible to "wake-up" (e.g., pulling virtual ground down to real ground) data/control-path logic that has had its leakage reduction logic active quickly, possibly even the same cycle that the data/control-path logic needs to be used, without introducing variances in di/dt that are too large. Retentive techniques may therefore produce acceptable L*di/dt noise even when applied at the pipeline stage level.

Since non-retentive techniques completely cut off power and ground, the internal nodes of the data/control-path logic may float up to full Vdd (or down to full Gnd). Waking up a large data/control-path quickly may therefore introduce significant L*di/dt noise. While non-retentive techniques provide better leakage reduction than retentive techniques, applying non-retentive techniques is more challenging.

Figure 3A:
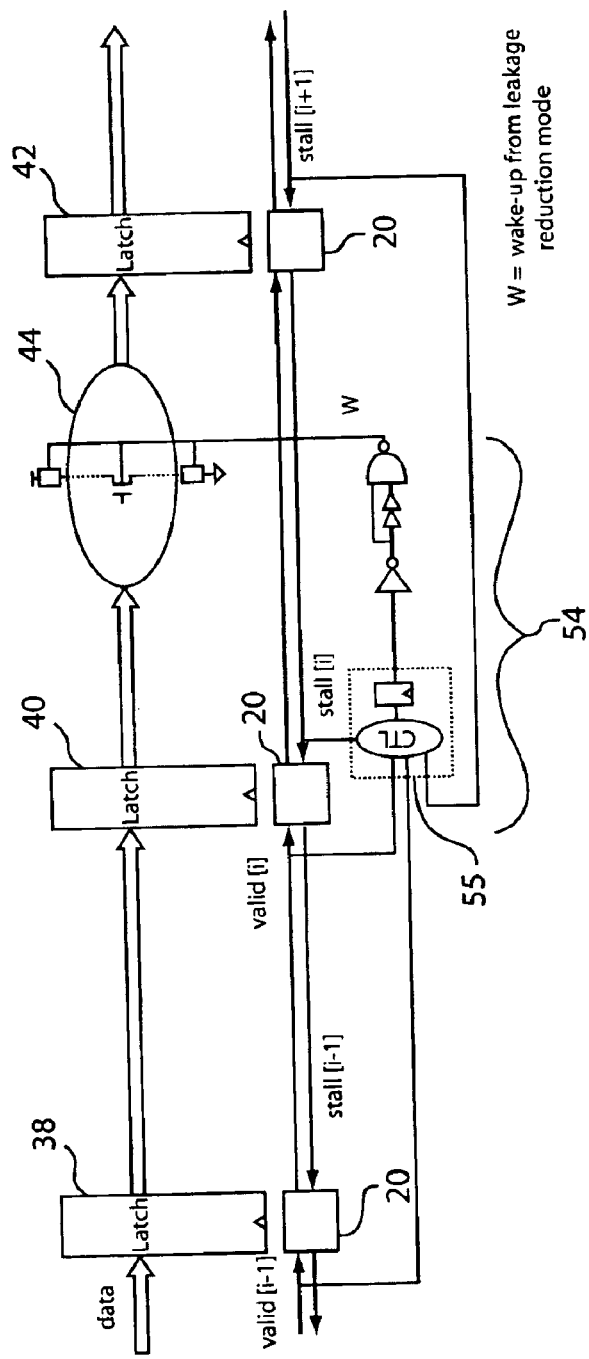
FIG. 3A is a block diagram showing an interlocked synchronous pipeline with improved deactivation logic with look ahead/behind feedback.

Referring to FIG. 3A, another embodiment shows a circuit with an improved deactivation decision for a leakage reduction control circuit 54. Currently known techniques to reduce the leakage power in data/control-paths involve driving large capacitive loads when the leakage reduction logic is activated, and deactivated. Because of this, activating and deactivating the leakage control logic or power reduction logic 44 should only be performed if the power lost to activation and deactivation does not offset the leakage power gained during the active phase.

Switching on and off the leakage reduction logic 44 may therefore not pay off if done at a cycle-by-cycle granularity. In the worst case, the leakage reduction logic 44 may turn on and off at each alternate cycle, which may cause more power overhead than what is saved by reducing the leakage. A look-behind scheme can be used to remove the situations where the leakage reduction logic 44 of a pipeline stage is switched on and off at alternate cycles. Assume that deactivating the data/control logic 54 (thus enabling the leakage reduction logic 44) of a pipeline stage pays off if there are N cycles before the stage is activated next. In the look-behind scheme, the valid indications of N upstream stages are forwarded to a downstream stage ahead of time. The downstream stage can look at these signals through control logic 54 and detect whether there is any new data arriving within the next N cycles. Hence, an improved decision may be made based on actual conditions of the stages in a pipeline. An embodiment of logic 54 is illustratively shown but may take other forms to provide different activation/deactivation schemes, which minimize power consumption and energy usage.

Figure 3B:
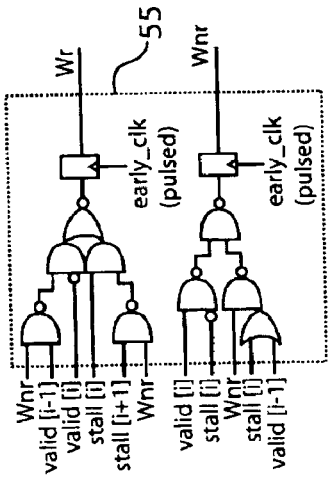
FIGS. 3B and 3C show instances of a control circuit shown in FIG. 3A.
Figure 3C:
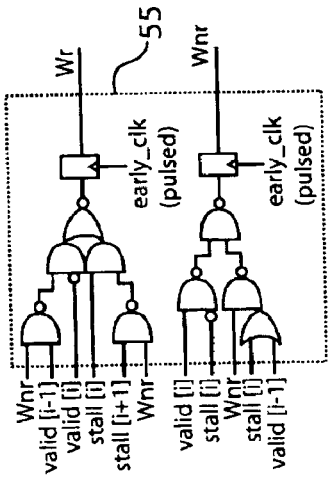

Examples of such schemes are illustratively shown in FIGS. 3B and 3C. FIG. 3B shows a non-stallable pipeline control circuit 55, which employs valid data input to control its output. FIG. 3C shows a more complex circuit 55 for a stallable pipeline control circuit 55, which employs both data valid and stall information from upstream and downstream stages to produce an output.

Deactivation in Linear Pipelines

Figure 4:
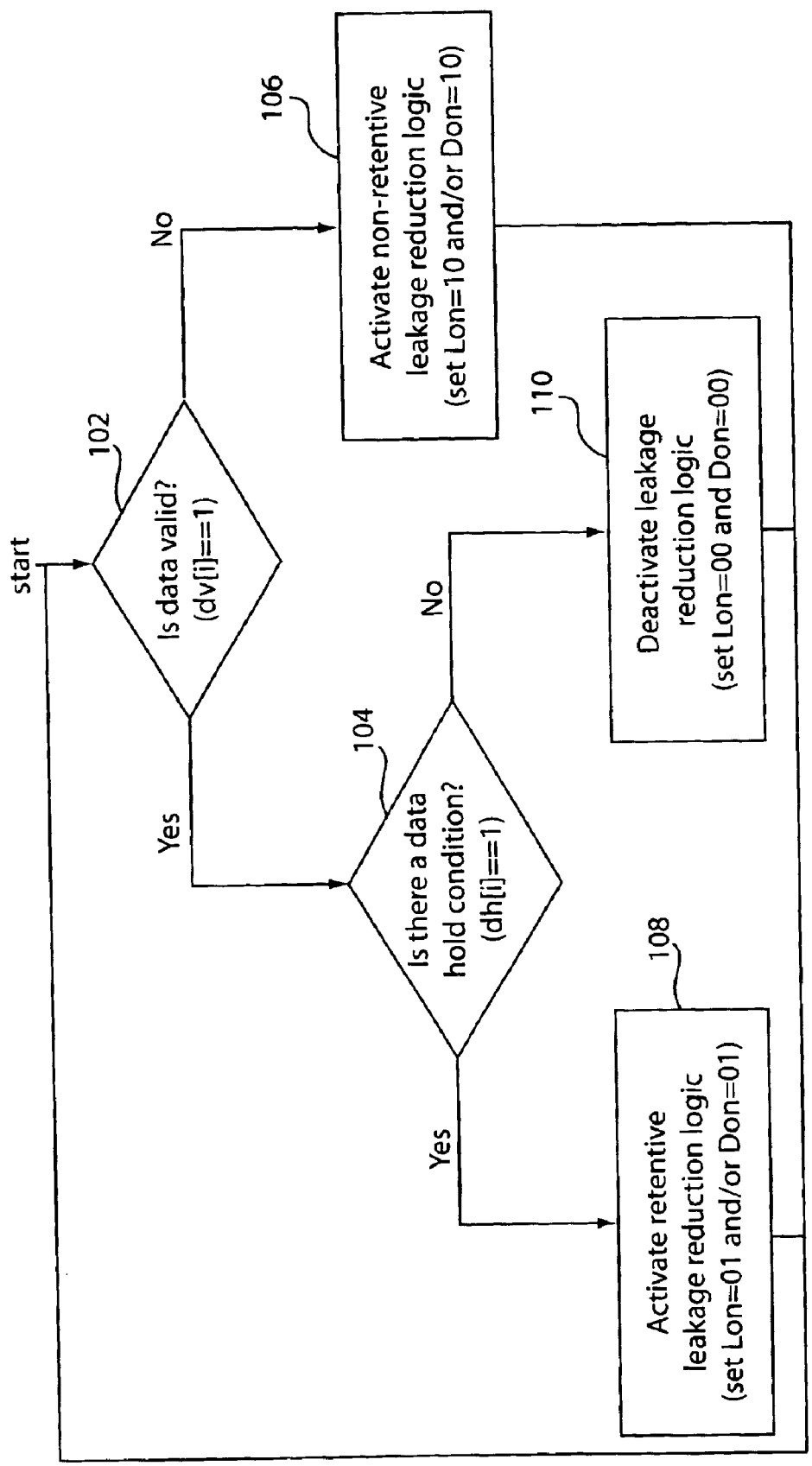
FIG. 4 is flow chart, which shows a capability of retentive and non-retentive activation of circuits in accordance with the present invention for one embodiment of a leakage control logic device.

Referring to FIG. 4 with continued reference to FIG. 1, a flow diagram illustrates one preferred embodiment with an improved deactivation decision to reduce power consumption. In block 102, a determination of valid data in the current stage i is tested (e.g., data valid signal, dv[i]==1. If the data condition is valid, a check to determine if the data has a hold condition is performed in block 104 (e.g., data hold signal, dh[i]==1). If the data is not valid, non-retentive leakage reduction logic is activated to save power in block 106 (set Lon=10 and/or Don=10). If there is a hold condition determined in block 104, retentive leakage reduction logic is activated in block 108 (set Lon=01 and/or Don=01). Otherwise leakage reduction logic is deactivated in block 110 (set Lon=00 and/or Don=00).

Leakage reduction logic 25 is activated or deactivated by control 22. Control 22 sends different signals to logic 25 as shown in FIG. 4 to activate or deactivate logic 25 and in different modes, e.g., retentive or non-retentive leakage reduction. The Don signal activates or deactivates logic 25 or 44 to control current leakage. The Lon signal is employed to activate or deactivate latches 16, e.g., to control current leakage. Each signal (Lon and Don) is arbitrarily assigned a binary word that is illustratively used to select retentive or non-retentive leakage reduction and activate or deactivate each mode.

Figure 5:
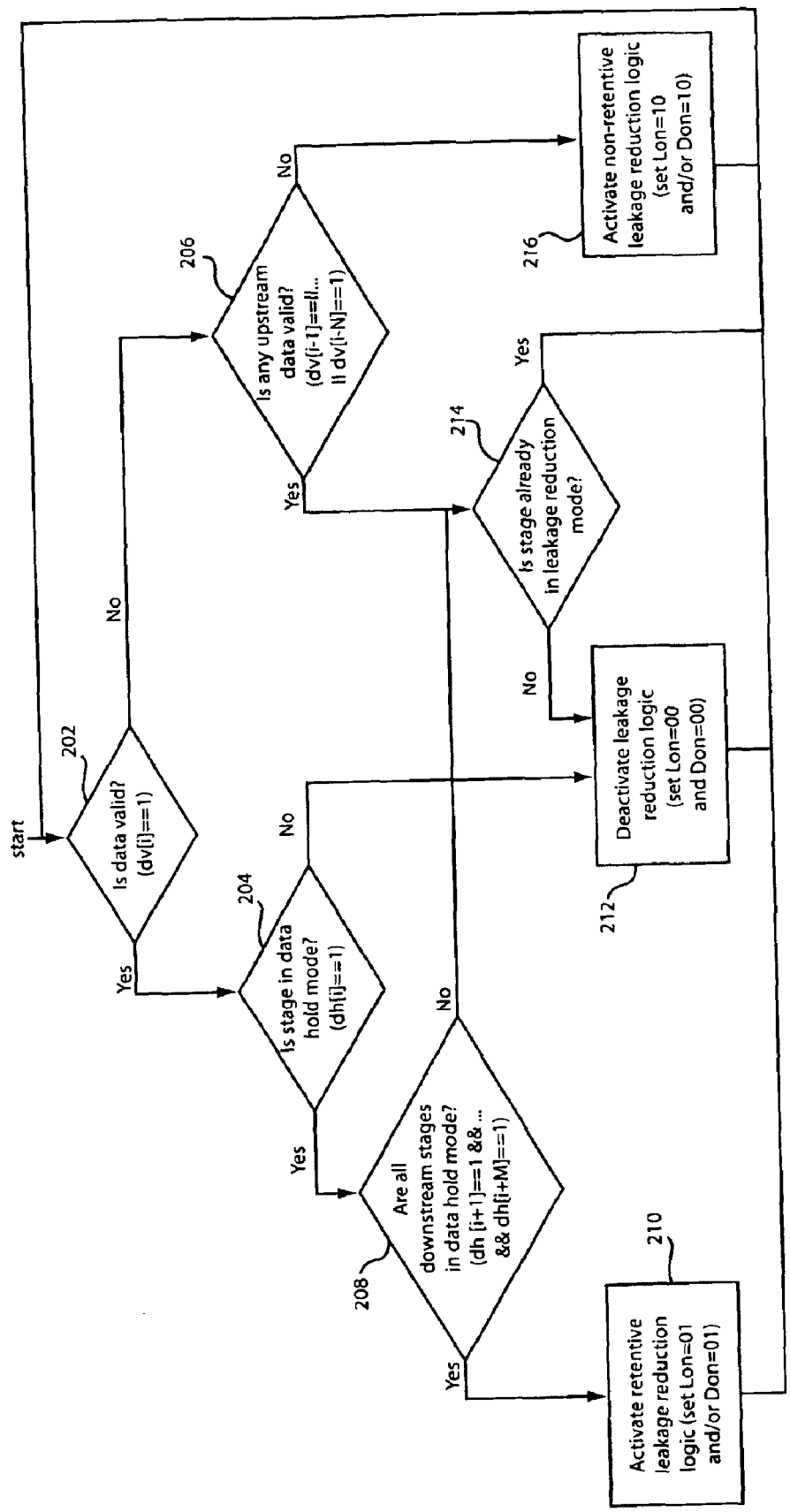
FIG. 5 is flow chart of an alternative embodiment of a leakage control logic device with look ahead and look behind features.

Referring to FIG. 5 with continued reference to FIG. 1, an alternative embodiment of a leakage control logic device with look ahead and look behind features is illustratively shown. In block 202 a check for valid data is performed (dv[i]==1). If the condition is true (yes), the current stage (i) is checked to determine if it is in data hold mode (dh[i]==1). If the current stage is in data hold mode a subset of other stages, e.g., downstream stages, are checked to determine if they are in hold mode in block 208 (e.g., dh[i+1]==1 && . . . && dh[i+M]==1). If all the stages in the subset of stages are in data hold mode then, in block 210 retentive leakage reduction logic is activated (e.g., set Lon=01 and/or Don=01). In block 214, a check is made to determine if the current stage is already in leakage reduction mode. If in leakage reduction mode already, the path returns to start to determine condition changes. Otherwise the leakage reduction logic is deactivated in block 212.

If in block 204, the current stage is not in data hold mode, then, in block 212, leakage reduction logic is deactivated (e.g., set Lon=00 and Don=00), and the path returns to start.

If in block 202, the data valid condition fails for the current stage a check of another subset of stages is checked to determine if the data is valid. In this example, the condition is any upstream stages that have data valid (e.g., dv[i−1]==1|| . . . || dv[i−N]==1). If yes, then block 214 is executed; otherwise non-retentive leakage reduction logic is activated in block 216 (e.g., Lon=10 and/or Don=10).

Asynchronous Pipeline

Making use of upstream and downstream requests and acknowledges to determine when the stage needs to be activated next is a more challenging problem in the asynchronous than the synchronous domain. Since there is no global sampling event in asynchronous pipelines, such as a synchronous clock, sensing the requests of N upstream stages needs that all N+1 stages are interlocked. Otherwise, metastability may ensue. The same holds for acknowledge signals. Improving the decision process of when to deactivate a pipeline stage is therefore not as straightforward in asynchronous pipelines.

Deactivation in Non-Linear Pipelines

Improving the deactivation decisions in non-linear pipelines is more difficult than in linear pipelines. This is due to not knowing in advance what branch of a pipeline valid data or stall conditions will go to. Deactivation may include more difficult implementations in pipelined branches and select structures.

Early Activation

In some situations, especially if non-retentive techniques are used, it may not be possible to activate the entire data/control-path during the same cycle it is to be used. This may be due either to signal ramp-up problems or di/dt noise problems. For example, in microprocessors with a clock grid structure and local clock blocks, no more than 4–5 gate delays separate the grid clock and the local c1/c2 clocks. It may therefore be difficult to provide a wake-up signal sufficiently in advance during the same clock cycle. Activating the pipeline stage in a staggered manner or one or more cycles in advance may therefore be necessary.

Staggered Activation

Figure 6:
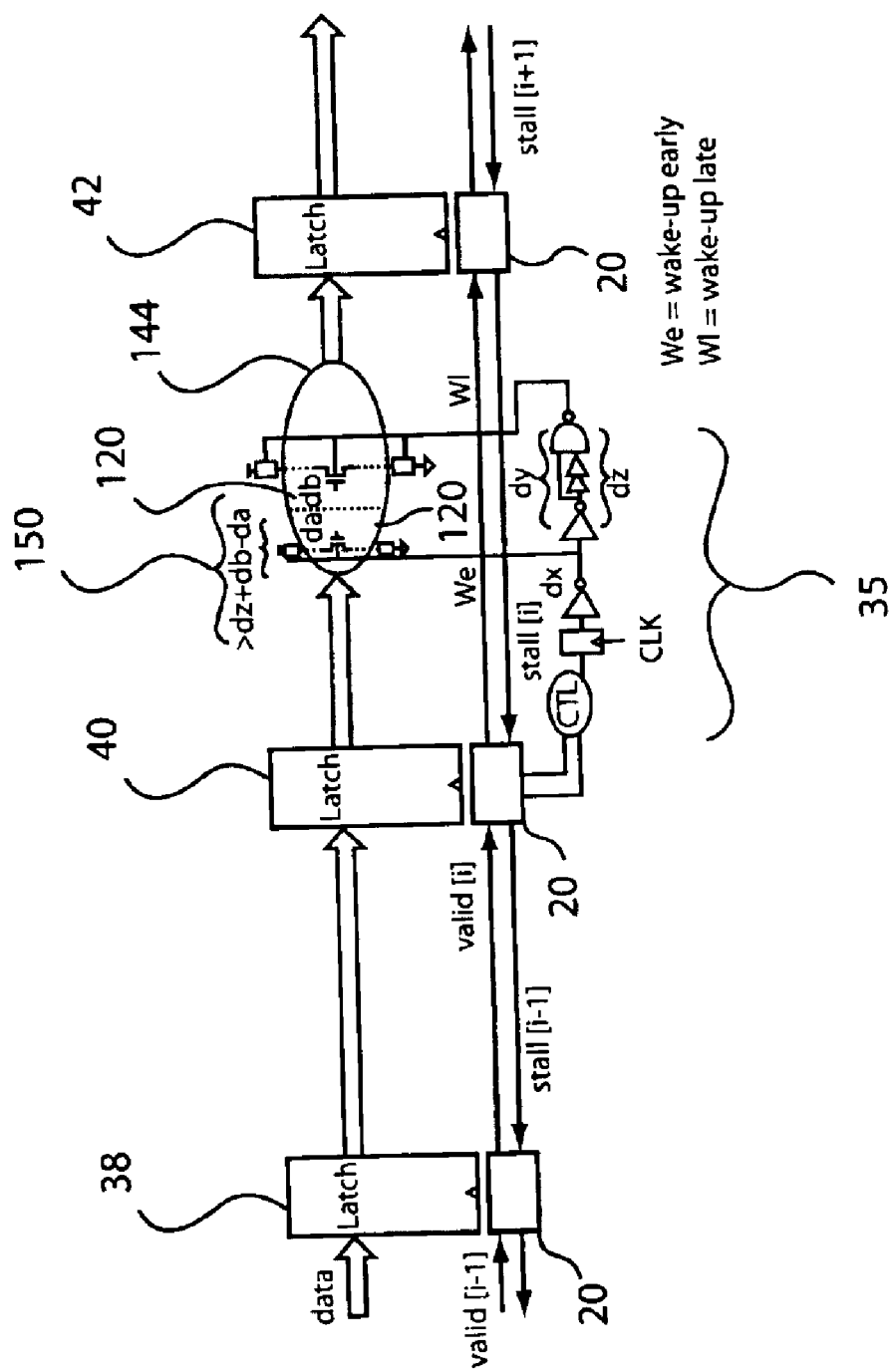
FIG. 6 is a block diagram showing a circuit with control logic for staggered activation of stages in accordance with aspects of the present invention.

Referring to FIG. 6, staggered activation permits the data/control-path to wake up piece-by-piece, reducing requirements on activation signal ramp up as well as reducing di/dt. Staggering the activation of a pipeline stage is achieved by dividing the data/control-path into several slices 120, and activating one slice at a time. Staggered activation is mostly suited for dynamic Vt techniques, but may also be used for Vdd/Gnd gating.

In this example, the activation is preferably performed in the same cycle as the activated data/control-path is used. A leakage gating signal is filtered through a latch or control circuit 35 for each stage to avoid glitches on the gating control signal. The latch 35 receives its clock (CLK) directly from a clock grid so that the gating signal from latch 35 is made available before new data arrives at the inputs of the data/control logic 144, thus providing sufficient time to return the virtual (gated) Vdd/Gnd to real Vdd/Gnd in logic 144. To provide extra time for the bulk of data/control logic 144 to return to real Vdd/Gnd, a small portion 150 closest to the data inputs are gated separately. Since the Gnd gating signal is latched early some timing constraints should be satisfied for the data/control logic 144 to operate correctly. These constraints are given by the delta gate delays of dx, dy, dz and the delta "return to real Gnd" delays of da, db. A special asymmetric delay is used to make dz>dy, which is needed to not gate the Gnd too early (while a current computation is still taking place in the data/control logic 144).

Early Activation in Linear Pipelines

Just as upstream valids and downstream stalls can be used to improve deactivation decisions, valids and stalls (holds) can be used to provide an early warning that the activation of the pipeline stage should be started.

The decision process thus becomes the following. The stage is activated (e.g., leakage reduction is deactivated) when there is new valid data arriving at the Nth upstream stage and the current stage is not stalled. If the current stage is stalled it is activated only when the Nth downstream stage is un-stalled. (see e.g., the flow charts in FIGS. 4 and 5 for look ahead implementations).

Early Activation in Non-Linear Pipelines

Due to branch structures, it may not be possible to know in advance which of multiple downstream pipelines will receive a new data item. Similarly, due to select structures, it may not be possible to know in advance which of multiple upstream pipelines will be un-stalled. In such situations, early activation may have to be speculative. Speculative situations may benefit from making use of partial activation, where for example, virtual ground is only partially pulled towards real ground and only pulled all the way to ground once the speculation has been resolved in later pipeline stages.

Pulse-Wave Controlled Leakage

Leakage reduction logic can be controlled at several different levels of granularity such as the unit level, stage level, and the gate level. At each of these levels, the activation and deactivation of leakage reduction logic can be viewed as a sliding window, or wave, moving forward in the pipeline. Inside the window, the leakage reduction logic is disabled to allow the data/control-path to compute at normal speed. Outside the window, leakage reduction logic is enabled to reduce the leakage. At the fine-grained gate level, this concept of a sliding window can be implemented as an enabling pulse propagating as a wave through the data/control-path logic, the forward edge of the wave disabling the leakage reduction logic to allow computation to take place at normal speed, and the rear edge again enabling the leakage reduction logic to save power. When such techniques are applied at the gate level, retentive leakage reduction techniques is preferably used.

Dynamic Vt

When using body contacts to alter the Vt of the transistors dynamically one can let an enable pulse propagate through the data/control-path as a wave, or sliding window, lowering the Vt within the window and raising the Vt outside the window. Outside the window leakage is reduced, while inside the window computation delay is improved. Taking this technique a step further, critical path transistors within the window can be forward body biased (FBB) resulting in a very low Vt with low delay, and transistors outside the window can be reverse body biased (RBB) resulting in a very high Vt with low leakage. If done at the right scale, such techniques may improve both delay and power.

Figure 7:
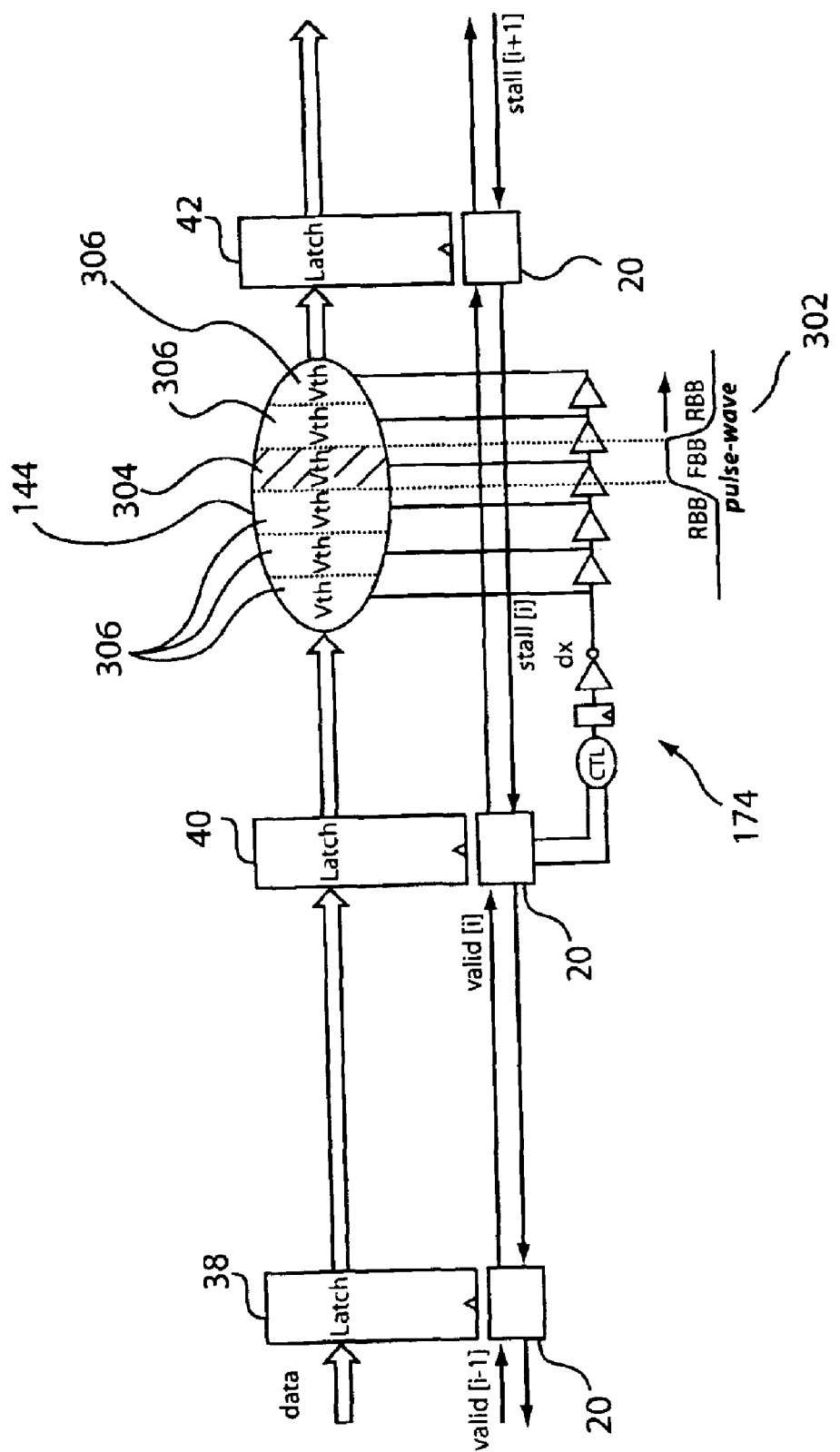
FIG. 7 is a block diagram showing wave controlled leakage reduction logic in accordance with the present invention.

Referring to FIG. 7, an example of a data/control-path that is divided into multiple slices 306 to enable wave-controlled leakage reduction is illustratively shown. As a "wave" 302 propagates forward in the data/control-path, the threshold voltages (represented by Vth in slice 304 in FIG. 7) of transistors currently inside the wave envelope are reduced by forward body biasing (FBB) providing reduced delay through the logic (see slice 304 of the data/control-path logic). Outside the wave 302 the transistors in slices 306 are reverse body biased (RBB)) to reduce leakage in the parts of the data/control-path logic 144 that is currently not actively computing. Since body biasing is a retentive technique, the values in the logic outside the wave are kept intact by control logic 174.

Figure 8:
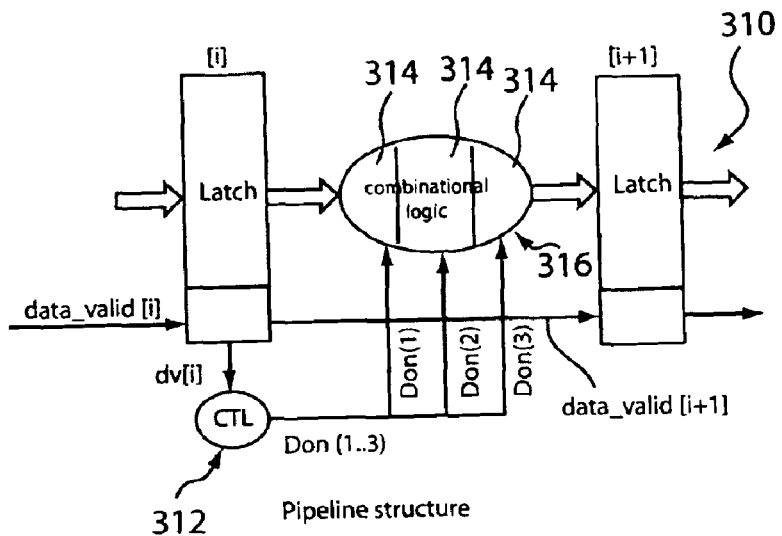
FIG. 8 is a block diagram showing wave controlled leakage reduction logic with control signals in accordance with the present invention.
Figure 9:
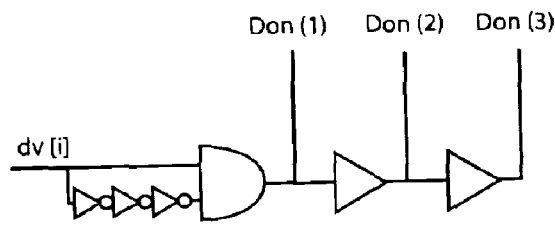
FIG. 9 is a block diagram showing control logic for FIG. 8 in further detail in accordance with the present invention.
Figure 10:
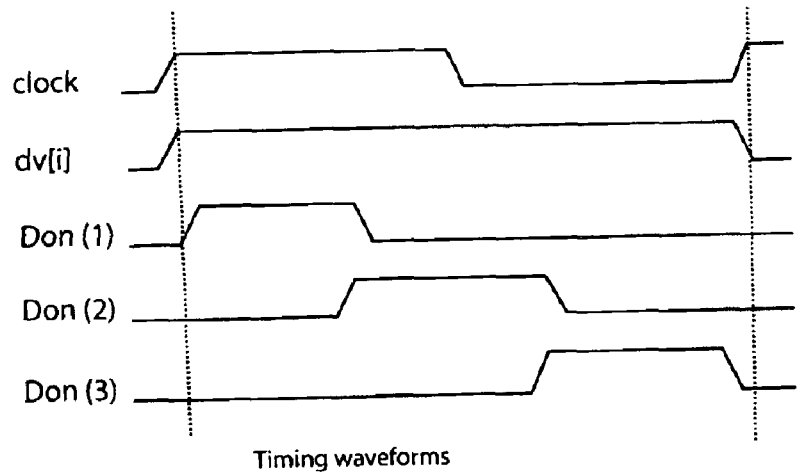
FIG. 10 is a timing diagram for the control logic of FIG. 9 in accordance with the present invention.

FIG. 8 shows a more general version of the embodiment shown in FIG. 7. A signal Don(1 . . . 3) is generated by control logic 312 based on data valid feedback from latch [i] and employed to activate portions or slices 314 of logic 316 to provide leakage reduction within a pipeline 310. FIG. 9 shows more detail of the logic of control circuit 312. FIG. 10 illustratively shows a timing diagram with Don(1 ... 3) and dv[i] signals relative to a clock signal (clock).

Vdd/Gnd Gating

The same wave-technique can be used for Vdd/Gnd gating techniques; however, the overhead for activating/deactivating the Vdd/Gnd gating logic may be more costly to perform on a cycle-by-cycle basis.

Wake-Up Completion Detection

In situations where wake-up in the worst case takes many cycles, for example due to constraints on maximum di/dt, average wake-up time can be improved by providing detection logic that detects when the wake up has completed. The variable factor in wake-up time depends primarily on the voltage level on internal nodes of the gated data/control-path. Rather than always waiting for the worst-case wake-up time, wake-up detection provides a ready signal once the virtual ground has reached a safe value. If the data/control-path nodes are already close to ground, the wake-up can be much faster than having to wait for the worst-case delay.

In synchronous pipelines, the ready signal, due to its asynchronous nature may be double-sampled to reduce the probability of the sampled ready signal going metastable. If the wake-up rate is known, this sampling overhead may be partially hidden by adjusting the voltage level that the ready signal is generated at to occur two cycles early.

Wake-up detection is especially suitable in asynchronous pipelines as the ready signal can be directly used in the same way as a request signal.

Complementary Unit Level Support

Providing information from the unit level may further improve the activation/deactivate decision making at the stage level, allowing the stage gating logic to look over ranges of units, rather than stages. Stage level control in turn provides stage-by-stage activation and deactivation reducing di/dt compared to activating/deactivation a whole unit at once. Combining unit level and stage level leakage control may therefore provide further improved power savings and reductions in di/dt.

Figure 11:
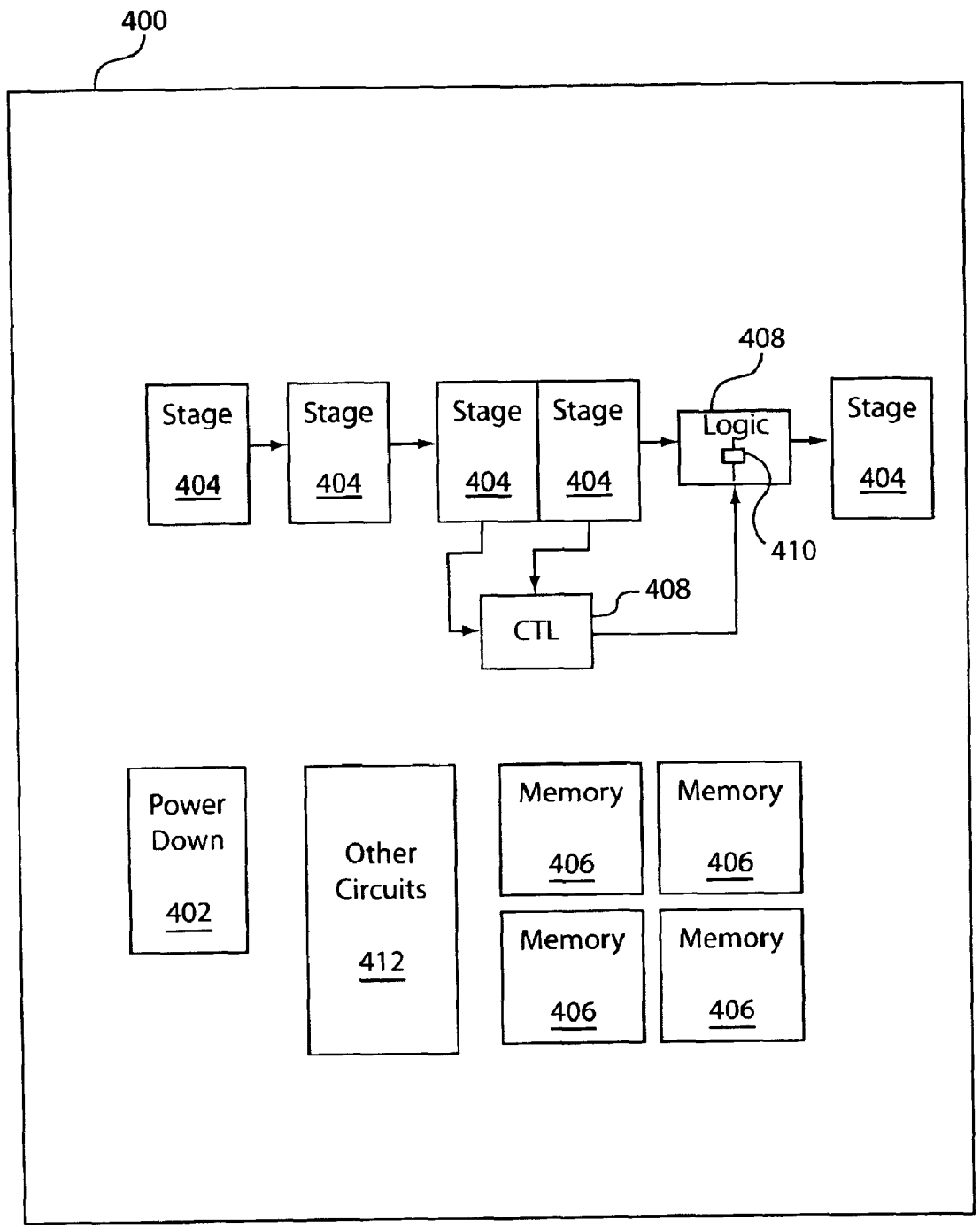
FIG. 11 is a block diagram of a system or chip showing different levels of power consumption management.

Referring to FIG. 11, a schematic diagram illustratively shows a system with power/current leakage reduction controls working in combination at different levels. Chip 400 includes a power down mode (sleep) or circuit 402, which may turn portions of chip 400 off in accordance with aspects of the present invention. In addition, pipeline stages 404, buffers and memory units 406 on chip 400 may include control logic 408 to control these devices during operation to reduce current leakage. In addition, control logic/power reduction 408 may be employed to control individual components 410 at the component level. Other circuits 412 may also be included. In accordance with aspects of the present invention, power consumption and current leakage may be controlled at three or more levels in a given system.

Unit Level Look-ahead

Due to the large power overhead in activating and deactivating leakage reduction logic look-ahead at the pipeline level may not be sufficient. Look-ahead across unit boundaries would be beneficial. Such look-ahead may at its simplest include a signal that indicates if any data whose destination is known (or is probable) to be the unit under consideration that it is present in the upstream unit(s). For example, in microprocessors, it is known early if an instruction is of the type load/store, fix-point, or floating-point. An early indication signal can thus be provided to the appropriate function unit to assist in decisions to activate/deactivate the unit, or stages of the unit.

More advanced unit level look-ahead is also possible and may involve, for example, in issue queues keeping track of expected minimum time before an instruction of a certain type will issue next (e.g., by score-boarding expected time for data dependencies to resolve).

Cycle Bounding the Maximum Leakage

Combining unit level and stage level gating techniques can yield further improved techniques especially for non-retentive gating. In non-retentive gating there is no restriction on how far internal nodes may float towards Vdd. To accommodate the worst-case situation, this places severe restrictions on how long in advance a stage can be activated. This in turn would limit the number of cycles that a stage can be deactivated.

However, while individual internal node values of data/control logic may not be trusted when using non-retentive gating, it may take several cycles before virtual ground will rise very far towards Vdd due to the significant total collected capacitance of the internal nodes. If a complementary unit level gating is guaranteed to turn on after a minimum number of cycles of no internal activity, before virtual ground has risen too high, stage level gating can assume it is safe to fully activate the data/control-path of a stage without need to control di/dt effects. This removes the necessity for pessimistic wait states at the stage level. Non-retentive gating techniques may therefore still be viable at the stage level.

Activation and deactivation conditions for leakage reduction circuitry based on data valid and data hold conditions have been illustratively presented in the context of synchronous and asynchronous pipelines. Multi-stage look-ahead extensions for improving deactivation decisions to further reduce power, and provide early activation for reduced di/dt effects are also disclosed. In addition, pulse-wave controlled activation/deactivation, which maximizes the time spent in reduced leakage mode have been described, and when used with FBB/RBB Vt biasing this can even improve critical path delay as well as reduce leakage power. Combined operation of unit level and stage level leakage control for improved decision making through unit level look-ahead, and reduced stage level control complexity and wait states through cycle bounded maximum leakage control support at the unit level are also provided in accordance with the present disclosure.

Having described preferred embodiments of a system and method (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as outlined by the appended claims. Having thus described the invention with the details and particularity required by the patent laws, what is claimed and desired protected by Letters Patent is set forth in the appended claims.

What is claimed is:

1. A leakage current control device, comprising:
   a circuit having one or more functions in a data path where the functions are executed in a sequence, each of the functions having power reduction logic to selectively energize each respective function wherein the power reduction logic is divided into individually enabled portions, each portion having a threshold voltage adjusted for transistors within each respective portion in accordance with the control sequence, wherein the threshold voltage for transistors is adjusted within each respective portion by controlling body biasing of the transistors; and a leakage control circuit, which interacts with the power reduction logic, so that the functions are energized or deenergized in a control sequence such the functions where the data is resident are energized and at least one of the other functions is not energized.

2. The device as recited in claim 1, wherein the circuit includes combinational logic.

3. The device as recited in claim 1, wherein the circuit includes a pipeline and the functions include combinational logic in a pipeline stage.

4. The device as recited in claim 1, wherein the circuit includes a pipeline and the functions include sequential logic in a pipeline stage.

5. The device as recited in claim 1, wherein the circuit includes a pipeline and tile functions are included in one or more stages of the pipeline.

6. The device as recited in claim 1, wherein the power reduction logic is divided into individually enabled portions, each portion being enabled in accordance with the control sequence.

7. The device as recited in claim 1, wherein the power reduction logic is energized in accordance with a pulse wave.

8. The device as recited in claim 1, wherein the power reduction logic is energized in accordance with a front edge of a pulse wave and at least partially deenergized in accordance with a back edge of the pulse wave.

9. The device as recited in claim 1, wherein at the power reduction logic is divided into individually enabled portions such that only a subset of the portions are energized at a time.

10. The device as recited in claim 9, wherein a pulse wave controls the individually enabled portions of the power reduction logic by adjusting transistor body bias.

11. The device as recited in claim 1, wherein the leakage control circuit selectively employs retentive and non-retentive means to reduce current leakage.

12. The device as recited in claim 11, wherein the retentive means includes body biasing of transistors.

13. The device as recited in claim 11, wherein the retentive means includes partial supply voltage and/or ground gating.

14. The device as recited in claim 11, wherein the non-retentive means includes supply voltage and/or ground gating.

15. The device as recited in claim 1, wherein the leakage control circuit controls power in the functions based on look-behind feedback from upstream functions in the data path.

16. The device as recited in claim 1, wherein the leakage control circuit controls power in the functions based on look-ahead feedback from downstream functions in the data path.

17. The device as recited in claim 1, wherein the device is employed in a system and performs at a subunit level, wherein the leakage control circuit selectively controls power at the subunit level in conjunction with system level power control to reduce current leakage and reduce power consumption.

18. The device as recited in 17, wherein individual components of the subunit are controlled at a component level by the leakage control circuit to selectively control power.

19. A leakage current control device comprising:

a pipeline having one or more stages, each stage including sequential logic and combinational logic, and being executed in a sequence, each of the stages having power reduction logic to selectively energize the respective stage;

a leakage control circuit which energizes, in a control sequence, the stages so that data progresses along the pipeline path to be resident at each stage in the sequence when the stage is energized and at least one of the other pipeline stages is not energized;

one or more look behind inputs to the leakage control circuit, each of the look behind inputs monitoring whether there is data in a prior stage of the pipeline; and a leakage control process that de-energizes one or more current stages if: there is no data in the current stage and each of the look behind input indicates there is no data in one or more of the prior stages.

20. The device as recited in claim 19, further comprising:

one or more look ahead inputs to the leakage control circuit, each of the look ahead inputs monitoring whether there is a data hold condition in a subsequent stage of the pipeline; and a leakage control process that at least partially de-energizes one or more current stages if: there is valid data in a current stage, the current stage is in a data hold condition, and all of the look ahead inputs indicate there is a data hold condition.

21. The device as recited in claim 20, wherein a stage is partially de-energized if the stage includes valid data and is in a data hold condition.

22. The device as recited in claim 19, the power reduction logic is divided into individually enabled portions, each portion being enabled in accordance with a control sequence.

23. The device as recited in claim 19, wherein the power reduction logic is divided into individually enabled portions, each portion having a threshold voltage adjusted for transistors within each respective portion in accordance with a control sequence.

24. The device as recited in claim 23, wherein the threshold voltage for transistors is adjusted within each respective portion by controlling body biasing of the transistors.

25. The device as recited in claim 19, wherein the leakage control circuit selectively employs retentive and non-retentive means to reduce current leakage.

26. The device as recited in claim 25, wherein the retentive means includes body biasing of transistors.

27. The device as recited in claim 25, wherein the retentive means includes partial supply voltage and/or ground gating.

28. The device as recited in claim 25, wherein the nonretentive means includes supply voltage and/or ground gating.

29. The device as recited in claim 19, wherein the device is employed in a system and performs at a subunit level, wherein the leakage control circuit selectively controls power at the subunit level in conjunction with system level power control to reduce current leakage and reduce power consumption.

30. The device as recited in claim 29, wherein individual components of the subunit are controlled at a component level by the leakage control circuit to selectively control power.

31. The device as recited in claim 19, wherein the power reduction logic is energized in accordance with a pulse wave.

32. The device as recited in claim 19, wherein the power reduction logic is energized in accordance with a front edge of a pulse wave and at least partially deenergized in accordance with a back edge of the pulse wave.

33. The device as recited in claim 19, wherein the power reduction logic is divided into individually enabled portions such that only a subset of the portions are energized at a time.

34. The device as recited in claim 33, wherein a pulse wave controls the individually enabled portions of the power reduction logic by adjusting transistor body bias.

35. A system for controlling power consumption, comprising:
- a unit level device including one or more subunits;
- a power control mechanism for selectively shutting down a portion of the unit level device;
- at least one subunit device including a leakage current control device, comprising:
  - a circuit having one or more functions in a data path where the functions are executed in a sequence, each of the functions having power reduction logic to selectively energize each respective function, the power reduction logic being divided into individually enabled portions, each portion having a threshold voltage adjusted for transistors within each respective portion in accordance with the control sequence, wherein the threshold voltage for transistors is adjusted within each respective portion by controlling body biasing of the transistors; and
  - a leakage control circuit, which interacts with the power reduction logic, so that the functions are energized or deenergized in a control sequence such the functions where the data is resident are energized and at least one of the other functions, is not energized.

36. The system as recited in claim 35, wherein the power reduction logic includes a sleep mode.

37. The system as recited in claim 35, wherein the power reduction logic is divided into individually enabled portions, each portion being enabled in accordance with the control sequence.

38. The system as recited in claim 35, wherein the leakage control circuit selectively employs retentive and nonretentive means to reduce current leakage.

39. The system as recited in claim 38, wherein the retentive means includes body biasing of transistors.

40. The system as recited in claim 38, wherein the retentive means includes partial supply voltage and/or ground gating.

41. The device as recited in claim 38, wherein the nonretentive means includes supply voltage and/or ground gating.

42. The system as recited in claim 35, wherein the leakage control circuit controls power in the functions based on look-behind feedback from upstream functions in the data path.

43. The system as recited in claim 35, wherein the leakage control circuit controls power in the functions based on look-ahead feedback from downstream functions in the data path.

44. The system as recited in claim 35, wherein the leakage control circuit selectively controls power at the subunit level in conjunction with the power control mechanism to reduce current leakage and reduce power consumption.

45. The system as recited in claim 44, wherein individual components of the subunit device are controlled at a component level by the power reduction logic to selectively control power.

46. The system as recited in claim 35, wherein the power reduction logic is energized in accordance with a pulse wave.

47. The system as recited in claim 35, wherein the power reduction logic is energized in accordance with a front edge of a pulse wave and at least partially deenergized in accordance with a back edge of the pulse wave.

48. The device as recited in claim 35, wherein the power reduction logic is divided into individually enabled portions such that only a subset of the portions are energized at a time.

49. The device as recited in claim 48, wherein a pulse wave controls the individually enabled portions of the power reduction logic by adjusting transistor body bias.

50. A leakage current control device, comprising:
- a circuit having one or more functions in a data path where the functions are executed in a sequence, each of the functions having power reduction logic to selectively energize each respective function; and
- a leakage control circuit, which interacts with the power reduction logic, so that the functions are energized or deenergized in a control sequence such the functions where the data is resident are energized and at least one of the other functions is not energized, wherein the leakage control circuit controls power in the functions based on look-behind feedback from upstream functions in the data path.

* * * * *